(12) United States Patent
Lin

(10) Patent No.: US 8,905,789 B2
(45) Date of Patent: Dec. 9, 2014

(54) ELECTRONIC DEVICE PACKAGE BOX HAVING A BASE UNIT AND A COVER UNIT WITH ELECTRONIC COMPONENTS

(75) Inventor: Chang-Liang Lin, Taoyuan County (TW)

(73) Assignee: Bothhand Enterprise Inc., Tainan (TW)

( * ) Notice: Subject to any disclaimer, the term of this patent is extended or adjusted under 35 U.S.C. 154(b) by 46 days.

(21) Appl. No.: 13/612,902

(22) Filed: Sep. 13, 2012

(65) Prior Publication Data

US 2013/0178104 A1    Jul. 11, 2013

(30) Foreign Application Priority Data

Jan. 6, 2012   (TW) .............................. 101200380 A

(51) Int. Cl.
*H01R 9/22*    (2006.01)
*H01F 27/02*   (2006.01)
*H01L 25/16*   (2006.01)

(52) U.S. Cl.
CPC ................ *H01R 9/22* (2013.01); *H01F 27/027* (2013.01); *H01R 9/226* (2013.01); *H01L 25/165* (2013.01); *H01L 2924/0002* (2013.01)
USPC ........................................................ 439/626

(58) Field of Classification Search
USPC ................................ 439/626, 331, 69, 73, 367
See application file for complete search history.

(56) References Cited

U.S. PATENT DOCUMENTS

| | | | | |
|---|---|---|---|---|
| 4,045,105 | A | * | 8/1977 | Lee et al. .......................... 439/69 |
| 4,433,886 | A | * | 2/1984 | Cassarly et al. ................. 439/65 |
| 4,618,739 | A | * | 10/1986 | Theobald ....................... 174/551 |
| 4,688,870 | A | * | 8/1987 | Egawa et al. .................. 439/331 |
| 5,100,333 | A | * | 3/1992 | Suzuki ............................. 439/73 |
| 2003/0162442 | A1 | * | 8/2003 | Panella ......................... 439/608 |

* cited by examiner

*Primary Examiner* — Chandrika Prasad
(74) *Attorney, Agent, or Firm* — Nixon & Vanderhye P.C.

(57) ABSTRACT

An electronic device package box includes a base having a pin-protruding face and a first mounting face for mounting a plurality of electronic components thereto, a plurality of first pins mounted to the base for electrical connection with the electronic components and each including a first connection section protruding from the pin-protruding face, a cover connected to and cooperating with the base to define a packaging space, and a plurality of second pins mounted to the cover for electrical connection with a plurality of electronic components. The cover has a second mounting face for mounting the electronic components thereto. Each second pin includes a second connection section protruding from one of the base and the cover.

10 Claims, 7 Drawing Sheets

ELECTRONIC DEVICE PACKAGE BOX HAVING A BASE UNIT AND A COVER UNIT WITH ELECTRONIC COMPONENTS

CROSS-REFERENCE TO RELATED APPLICATION

This application claims priority of Taiwanese Patent Application No. 101200380, filed on Jan. 6, 2012.

BACKGROUND OF THE INVENTION

1. Field of the Invention

This invention relates to a package box, more particularly an electronic device package box.

2. Description of the Related Art

Referring to FIG. 1, a conventional electronic device package box 1 for packaging a plurality of coiled electronic components 10 comprises a substrate 11, a plurality of mounting boards 12 spacedly disposed above the substrate 11, a plurality of pins 13 mounted correspondingly on the mounting boards 12 and protruding from the substrate 11, and a cover 14 covering the substrate 11 and the mounting boards 12. Each of the pins 13 has an inner protruding section 131 which protrudes from a top side of one of the mounting boards 12, and an outer protruding section 132 which protrudes from a bottom side of the substrate 11. The cover 14 has a top wall 141 parallel to the substrate 11, and a surrounding wall 142 extending from an outer periphery of the top wall 141 toward the substrate 11. Each electronic component 10 is electrically connected to at least one of the pins 13. The outer protruding sections 132 of the pins 13 may be inserted into, for example, a circuit board (not shown).

The cover 14 and the substrate 11 cooperatively define a packaging space for packaging the mounting boards 12, the electronic components 10 and portions of the pins 13. Although the conventional electronic device package box 1 can achieve its intended purpose, in order to mount the electronic components 10 and the pins 13, the mounting boards 12 having different heights must be disposed between the top wall 141 of the cover 14 and the substrate 11 so as to accommodate sufficient number of electronic components 10. Hence, the conventional electronic device package box 1 not only has many components, integration and assembly of the components thereof are also complicated.

SUMMARY OF THE INVENTION

Therefore, an object of the present invention is to provide an electronic device package box that is capable of overcoming the aforesaid drawbacks associated with the prior art.

Accordingly, an electronic device package box of this invention includes a base unit and a cover unit. The base unit includes a base, and a plurality of first pins mounted to the base and adapted to be electrically connected to a plurality of electronic components. The base has a pin-protruding face, and a first mounting face for mounting the electronic components thereto. Each of the first pins includes a first connection section protruding from the pin-protruding face. The cover unit includes a cover connected to and cooperating with the base to define a packaging space, and a plurality of second pins mounted to the cover and adapted to be electrically connected to a plurality of electronic components. The cover has a second mounting face facing the packaging space for mounting the electronic components thereto. Each of the second pins includes a second connection section protruding from one of the base and the cover.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
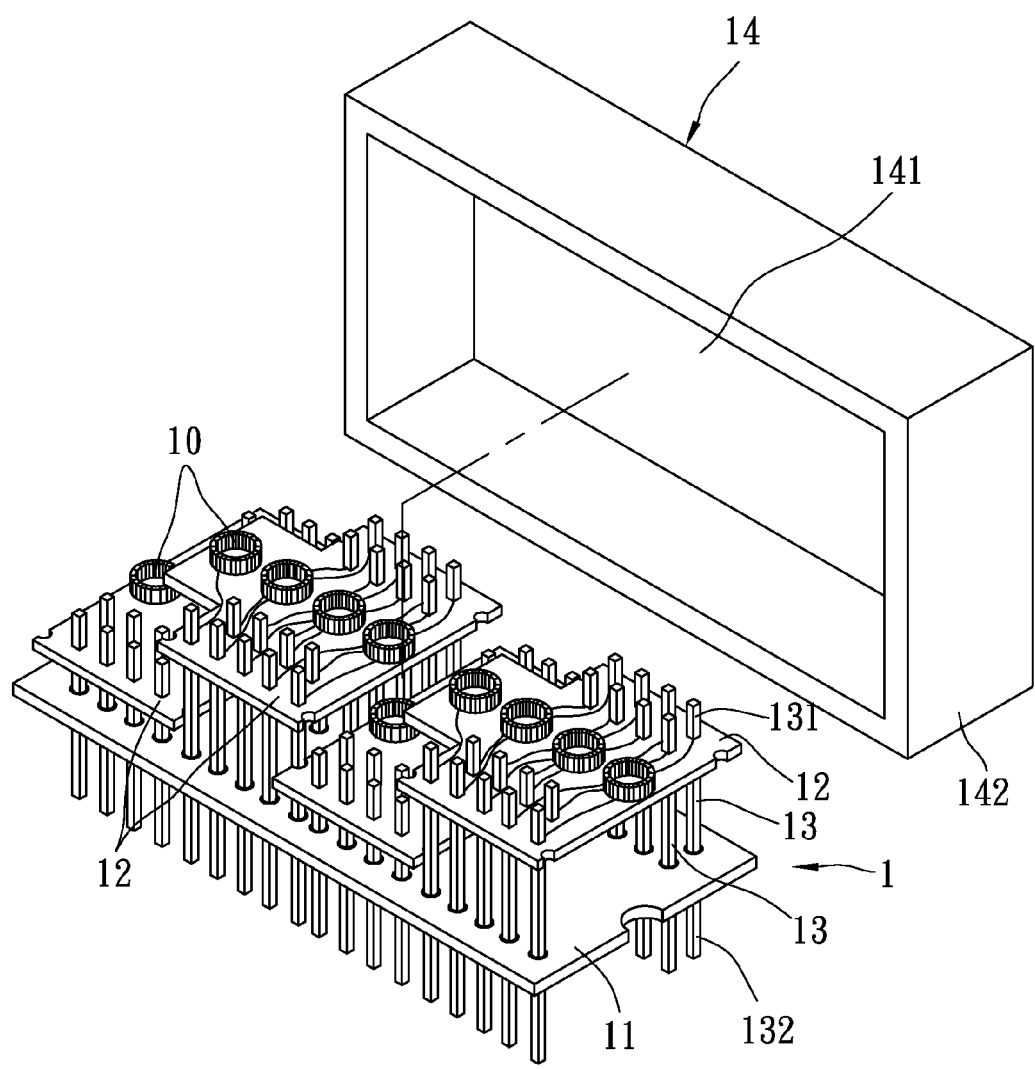
FIG. 1 is an exploded perspective view of a conventional electronic device package box.

Before the present invention is described in greater detail, it should be noted herein that like elements are denoted by the same reference numerals throughout the disclosure.

Figure 2:
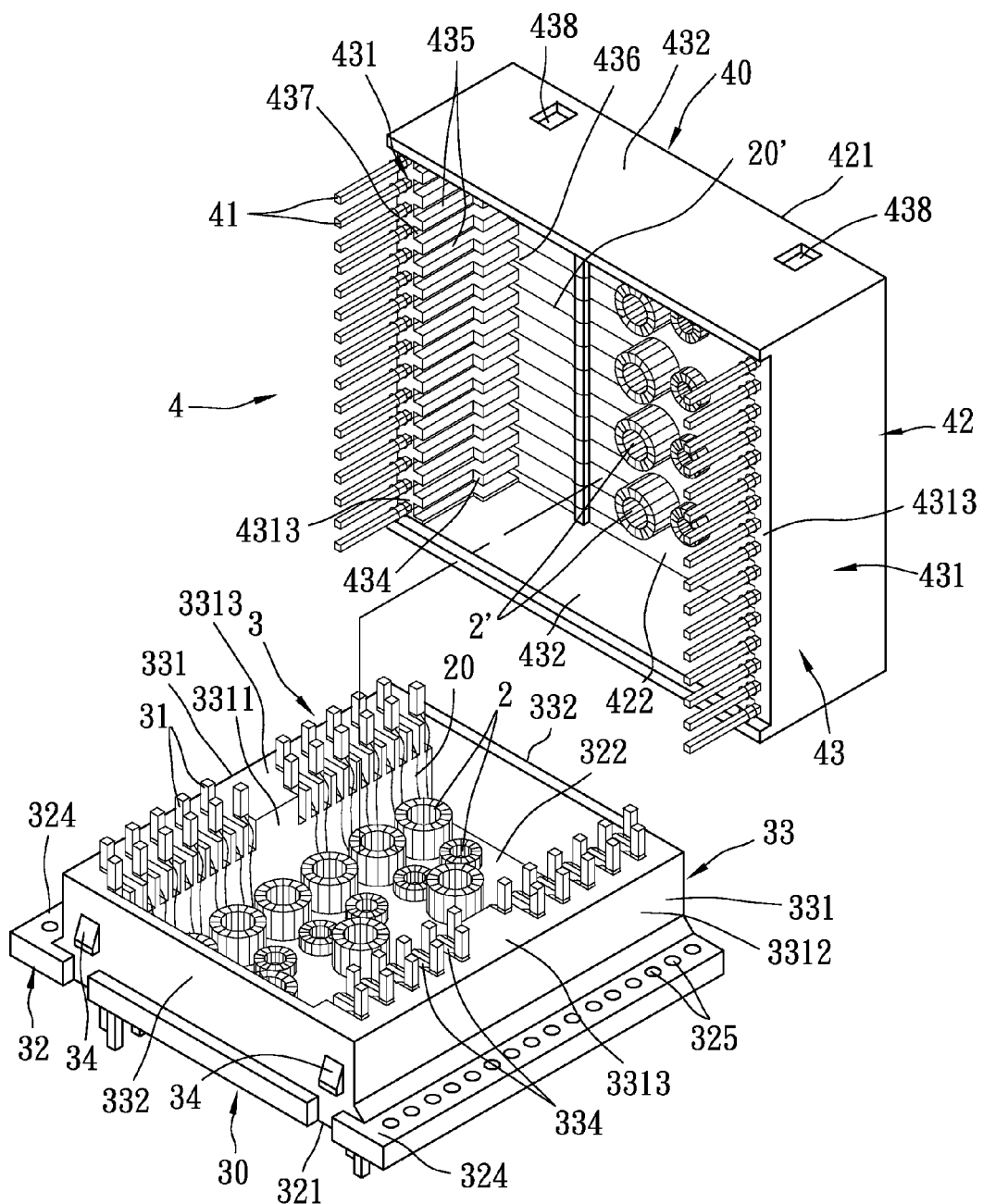
FIG. 2 is an exploded perspective view of an electronic device package box according to the first preferred embodiment of this invention.
Figure 3:
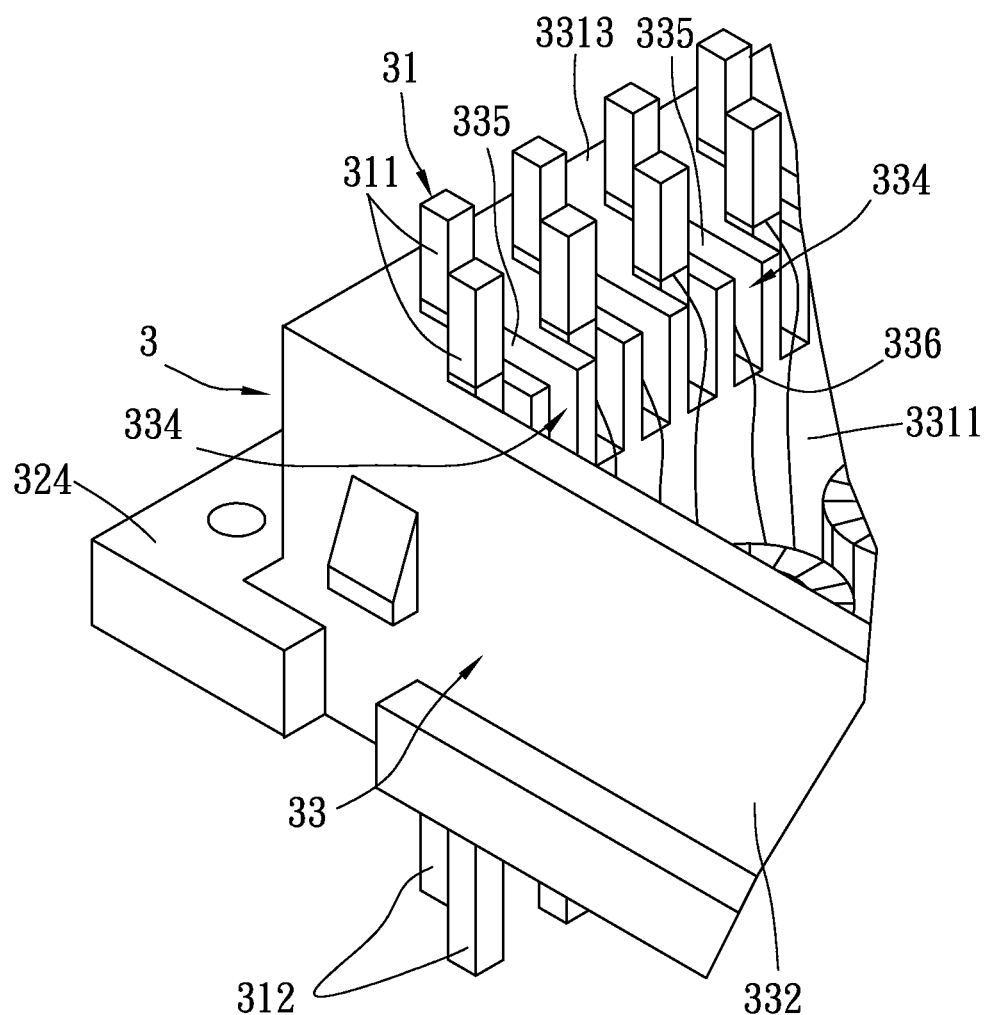
FIG. 3 is a fragmentary perspective view of a base unit of the first preferred embodiment.
Figure 4:
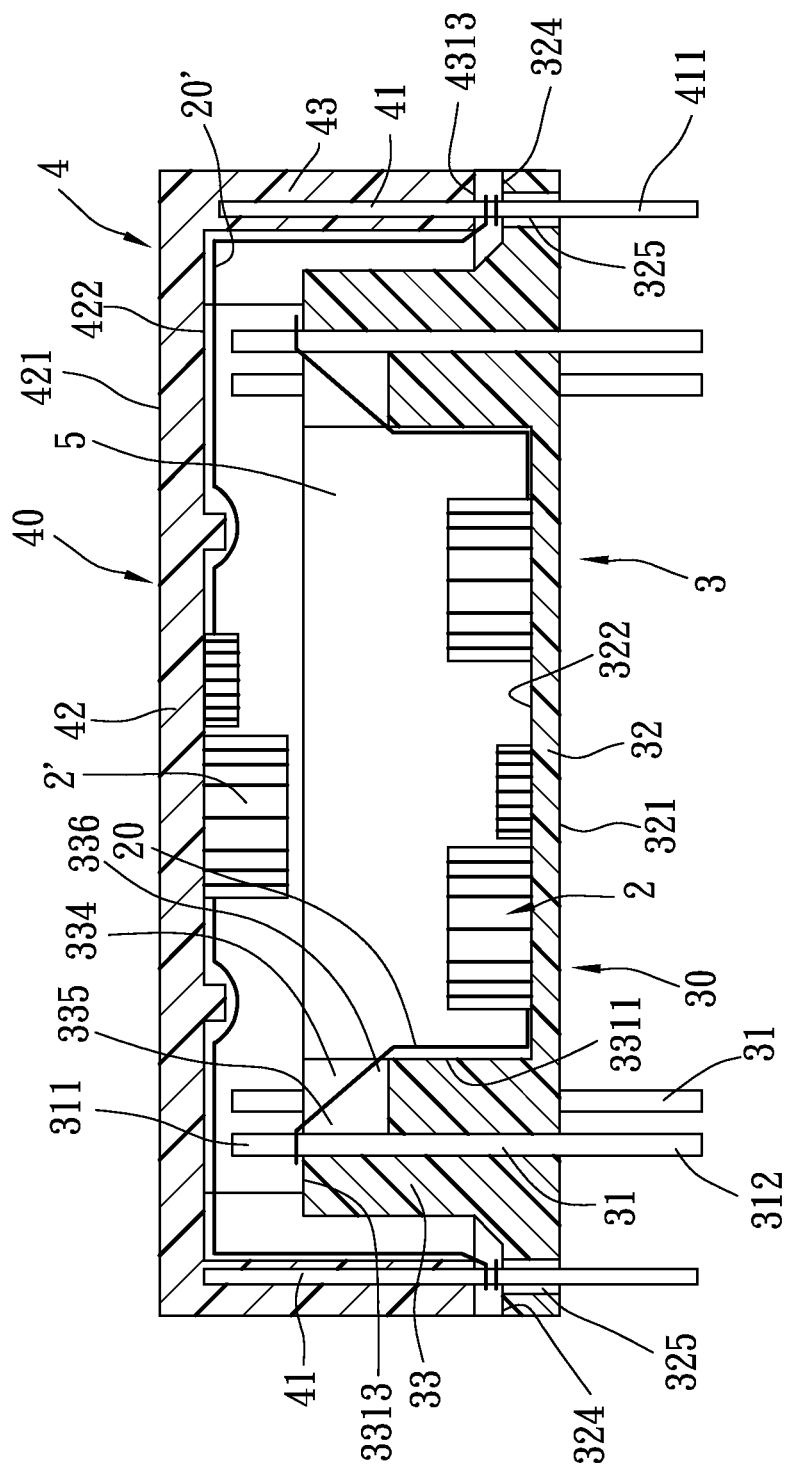
FIG. 4 is a sectional view of the first preferred embodiment in an assembled state.

Referring to FIGS. 2 to 4, an electronic device package box according to the first preferred embodiment of this invention is adapted to be mounted with a plurality of electronic components 2, 2', and comprises a base unit 3 and a cover unit 4. The electronic components 2 of the base unit, or base group of electronic components, and the electronic components 2' of the cover unit, or cover group of electronic components are illustrated herein as coiled electronic components.

The base unit 3 includes a base 30, and a plurality of first pins 31 mounted to the base 30 and adapted to be electrically connected to a portion of the electronic components 2. The base 30 includes a first mounting wall 32, a base surrounding wall 33 extending upwardly from the first mounting wall 32, and a plurality of engaging pieces 34 projecting outwardly from the base surrounding wall 33. The first mounting wall 32 has a pin-protruding face 321, a first mounting face 322 parallel and opposite to the pin-protruding face 321 and surrounded by the base surrounding wall 33, two extensions 324 extending outwardly and respectively from two opposite sides of the first mounting wall 32 and disposed externally of the base surrounding wall 33, and a plurality of insert holes 325 formed in the extensions 324. The insert holes 325 in each extension 324 are arranged in a straight line along the length of the corresponding extension 324.

The base surrounding wall 33 includes two opposite first sidewalls 331, and two opposite second sidewalls 332 connected transversely to and disposed between the first sidewalls 331. Each of the first sidewalls 331 includes an inner wall face 3311 proximate to the first mounting face 322, an outer wall face 3312 spaced apart from the inner wall face 3311, a first abutment face 3313 connected between the inner and outer wall faces 3311, 3312, and a plurality of first slots 334 formed in the first abutment face 3313. Each of the first slots 334 has a wire-outlet end 335 located on the first abutment face 3313, and a wire-inlet end 336 proximate to the inner wall face 3311. In this embodiment, the wire-outlet ends 335 of the first slots 334 are arranged in a staggered manner. The engaging pieces 34 are provided in pairs on outer faces of the second sidewalls 332 of the base surrounding wall 33.

The first pins 31 of this embodiment are directly embedded in the base 30 during formation of the base 30. Each of the first pins 31 includes a wire tying section 311 protruding from the first abutment face 3313 and proximate to the wire-outlet end 335 of a respective first slot 334, and a first connection section 312 protruding from the pin-protruding face 321. The electronic components 2 are mounted on the first mounting face 322. Each electronic component 2 is connected electrically to at least one of the pins 31 by using a guide wire 20. The guide wire 20 is inserted into the wire-inlet end 336 of one of the first slots 334, and is tied to the wire tying section 311 of one of the pins 31 after extending out of the wire-outlet end 335 of said one of the first slots 334.

The cover unit 4 of this embodiment includes a cover 40 connected to and cooperating with the base 30 to define a packaging space 5, and a plurality of second pins 41 embedded in the cover 40. The cover 40 includes a second mounting wall 42 parallel to the first mounting wall 32, and a cover surrounding wall 43 extending from a periphery of the second mounting wall 42 toward the base 30. The second mounting wall 42 has a top face 421, and a second mounting face 422 that is parallel and opposite to the top face 421, that faces the packaging space 5, and that is surrounded by the cover surrounding wall 43. The cover surrounding wall 43 includes two opposite first sidewalls 431, and two opposite second sidewalls 432 connected transversely to and disposed between the first sidewalls 431. Each of the first sidewalls 431 has a stepped configuration, and includes a pin-protruding face 4313 proximate to a respective one of the extensions 324, a second abutment face 434 that is located between the pin-protruding face 4313 and the second mounting face 422 and that abuts against the first abutment face 3313 of a respective one of the first sidewalls 331, and a plurality of second slots 435. Each of the second slots 435 has a wire-inlet end 436 proximate to the second mounting face 422, and a wire-outlet end 437 located on the pin-protruding face 4313 of the respective first sidewall 431. Each of the second sidewalls 432 is provided with a pair of engaging holes 438 that receive engagingly and respectively the pair of the engaging pieces 34 of a respective second sidewall 332 of the base 30 to thereby connect the cover 40 to the base 30.

In this embodiment, each of the second pins 41 includes a second connection section 411 extending through a respective one of the insert holes 325 to protrude from the pin-protruding face 321 of the base 30, as best shown in FIG. 4.

The electronic components 2' are mounted on the second mounting face 422. Each electronic component 2' is connected electrically to at least one of the pins 41 by using a wire 20'. The wire 20' is inserted into the wire-inlet end 436 of one of the second slots 435, and is tied to one of the pins 41 after extending out of the wire-outlet end 437 of said one of the second slots 435.

During assembly of the package box of the present invention, the electronic components 2, 2' are first mounted correspondingly to the first mounting face 322 of the base 30 and the second mounting face 422 of the cover 40, after which the cover 40 covers the base 30. The second connection sections 411 of the second pins 41 extend through the respective insert holes 325 and protrude from the pin-protruding face 321 of the base 30. Further, the second connection sections 411 of the second pins 41 are spaced apart from the first connection sections 312 of the first pins 31.

Figure 5:
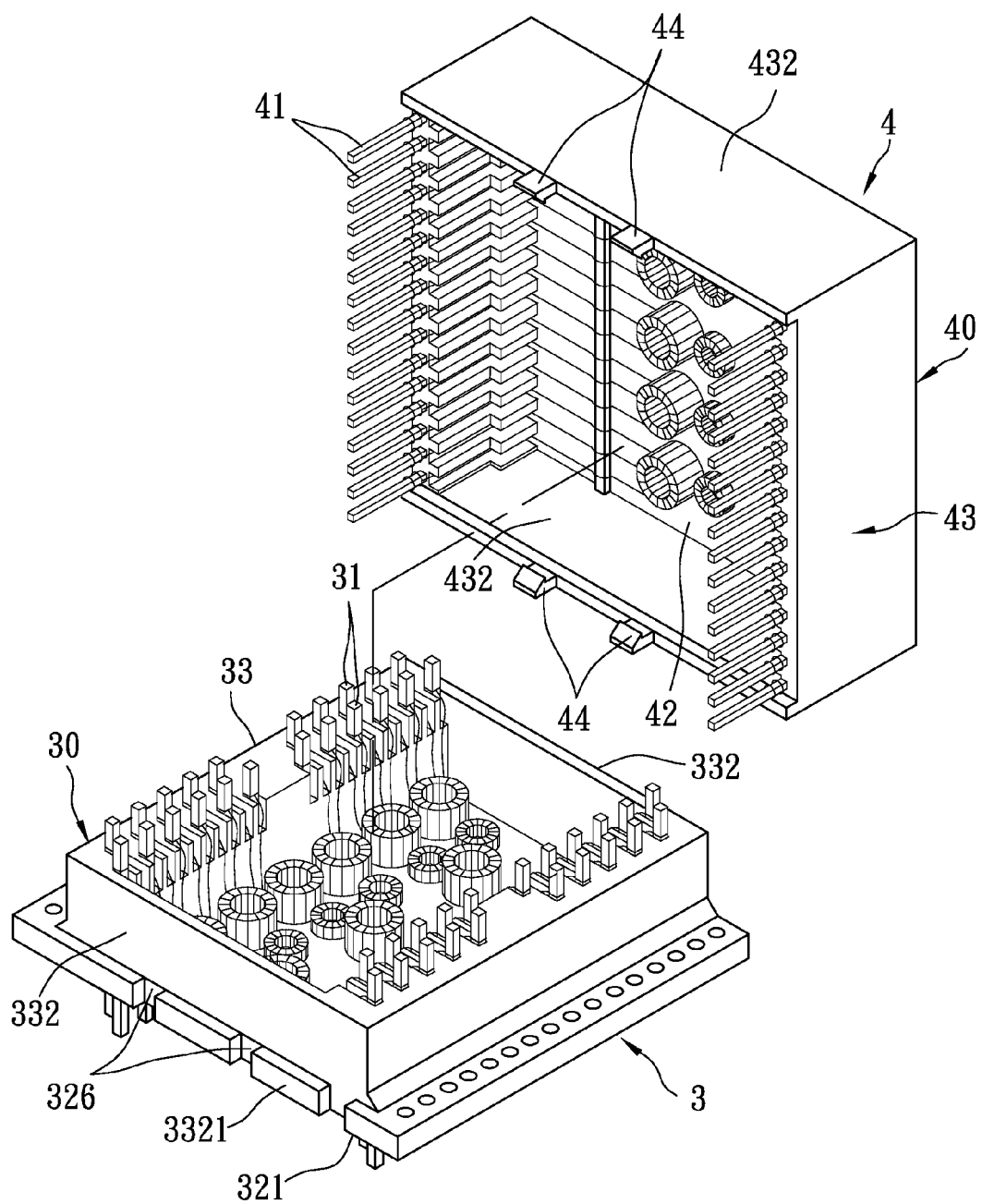
FIG. 5 is an exploded perspective view of an electronic device package box according to the second preferred embodiment of this invention.

Referring to FIG. 5, the second preferred embodiment of the electronic device package box according to this invention is shown to be similar to the first preferred embodiment. However, in this embodiment, each of the second sidewalls 332 of the base surrounding wall 33 has an extension 3321 formed with a pair of notches 326, and each of the second sidewalls 432 of the cover surrounding wall 43 has a pair of hooks 44 that pass respectively through the notches 326 to engage with the pin-protruding face 321 of the base 30, thereby connecting the cover 40 to the base 30.

Figure 6:
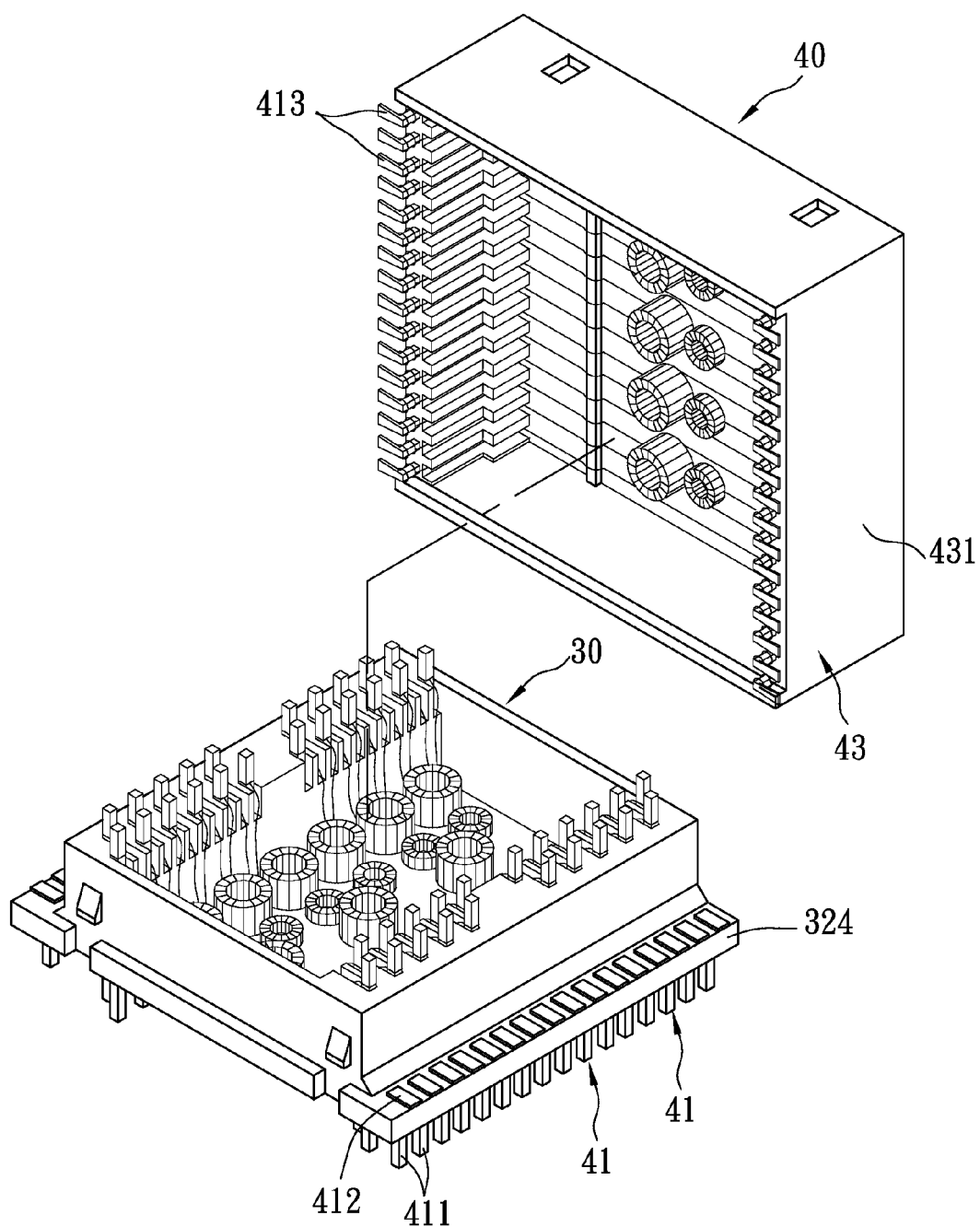
FIG. 6 is an exploded perspective view of an electronic device package box according to the third preferred embodiment of this invention.

Referring to FIG. 6, the third preferred embodiment of the electronic device package box according to this invention is shown to be similar to the first preferred embodiment. However, in this embodiment, each of the second pins 41 further includes a contact section 413 mounted to the corresponding first sidewall 431 of the cover surrounding wall 43, and the second connection sections 411 of the second pins 41 are mounted to the corresponding extensions 324 of the base 30 such that when the cover 40 is connected to the base 30, the contact sections 413 of the second pins 41 can respectively and electrically contact portions 412 of the second connection sections 411 that protrude from the corresponding insert holes 325 (see FIG. 2) of the extensions 324.

Figure 7:
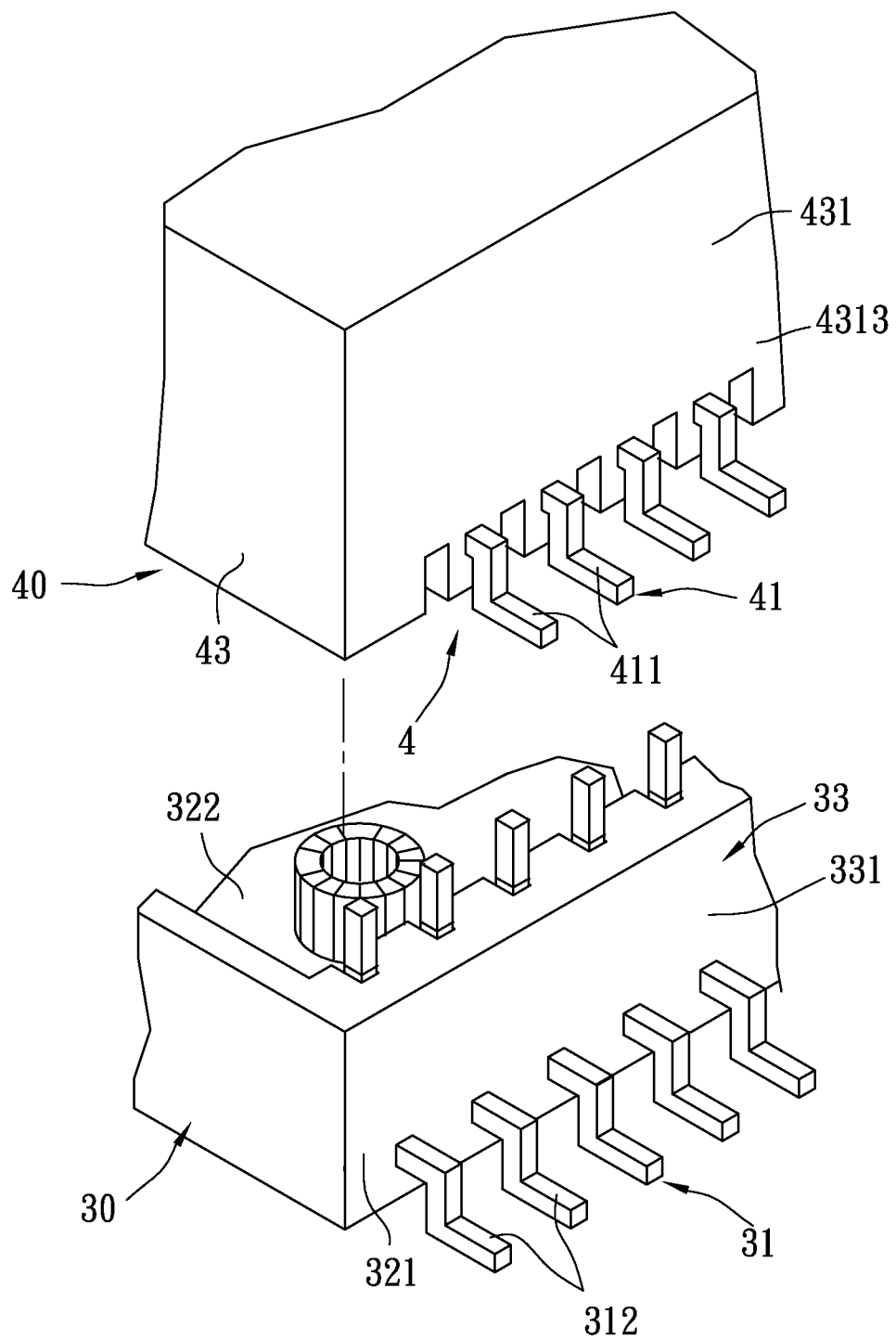
FIG. 7 is a fragmentary exploded perspective view of an electronic device package box according to the fourth preferred embodiment of this invention.

Referring to FIG. 7, the fourth preferred embodiment of the electronic device package box according to this invention is shown to be similar to the first embodiment. However, in this embodiment, the first sidewalls 331 (only one of the first sidewalls 331 is shown) of the base surrounding wall 33 are respectively provided with the pin-protruding face 321 which is perpendicular to the first mounting face 322, and the first connection sections 312 of the first pins 31 protrude from the pin-protruding faces 321 of the first sidewalls 331. The first sidewalls 431 (only one of the first sidewalls 431 is shown) of the cover surrounding wall 43 are respectively provided with the pin-protruding face 4313 which is perpendicular to the second mounting face 422 (see FIG. 2). The second connection sections 411 of the second pins 41 protrude from the pin-protruding faces 4313 of the first sidewalls 431.

From the aforesaid description, it is apparent that the present invention uses the first and second mounting faces 322, 422 to mount the electronic components 2, 2' thereto. Not only is this structure not found in the conventional package box, the aforesaid construction can also permit three-dimensional mounting of the electronic components 2, 2' without the aid of other mounting plates. The present invention makes full use of the base 30 and the cover 40 to mount the electronic components 2, 2' thereto, so that the components of the package box are not only simplified, integration and installation of the electronic components 2, 2' are also made convenient.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:
1. An electronic device package box, comprising:
a base unit including a base, and a plurality of first pins mounted to said base and adapted to be electrically connected to a base group of electronic components, said base having a pin-protruding face, and a first mounting face for mounting the base group of electronic compo- nents thereto, each of said first pins including a first connection section protruding from said pin-protruding face; and a cover unit including a cover connected to and cooperating with said base to define a packaging space, and a plurality of second pins mounted to said cover and adapted to be electrically connected to a cover group of electronic components, said cover having a second mounting face facing said packaging space for mounting the cover group of electronic components thereto, each of said second pins including a second connection section protruding from at least one of said base and said cover, said second connection section of each of said second pins being electrically spaced apart from said first connection sections of the first pins.

2. The electronic device package box of claim 1, wherein said first mounting face is opposite to said pin-protruding face, and said second connection section of each of said second pins protrudes from said pin-protruding face.

3. The electronic device package box of claim 2, wherein said base includes a first mounting wall having said pin-protruding face and said first mounting face, a base surrounding wall extending from said first mounting wall toward said cover, and two extensions extending outwardly and respectively from two opposite sides of said first mounting wall and disposed externally of said base surrounding wall, and a plurality of insert holes formed in said extensions, said pin-protruding face of said base extending from said first mounting wall to said extensions, said second connection section of each of said second pins extending through a respective one of said insert holes to protrude from said pin-protruding face of said base.

4. The electronic device package box of claim 3, wherein said cover includes a second mounting wall having said second mounting face, and a cover surrounding wall extending from said second mounting wall toward said base, said cover surrounding wall having two spaced-apart pin-protruding faces respectively proximate to said extensions, said second connection sections of said second pins protruding correspondingly from said pin-protruding faces of said cover surrounding wall to extend respectively through said insert holes in said extensions.

5. The electronic device package box of claim 4, wherein said base surrounding wall has a first abutment face facing said second mounting wall, said cover surrounding wall further having a second abutment face abutting against said first abutment face, each of said first pins further including a wire tying section protruding from said first abutment face and adapted to be electrically connected to a corresponding one of the base group of electronic components that are mounted to said first mounting face.

6. The electronic device package box of claim 5, wherein said cover surrounding wall further has a plurality of engaging holes, and said base surrounding wall further has a plurality of engaging pieces engaged respectively to said engaging holes.

7. The electronic device package box of claim 6, wherein said base surrounding wall further has a plurality of first slots, each of said first slots having a wire-inlet end proximate to said first mounting face and a wire-outlet end proximate to said first abutment face, said cover surrounding wall further having a plurality of second slots, each of said second slots having a wire-inlet end proximate to said second mounting face and a wire-outlet end provided on a corresponding one of said pin-protruding faces of said cover surrounding wall.

8. The electronic device package box of claim 7, wherein said wire-outlet ends of said first slots are arranged in a staggered manner.

9. The electronic device package box of claim 1, wherein said cover includes a second mounting wall having said second mounting face, and a cover surrounding wall extending from said second mounting wall toward said base, said cover surrounding wall having a plurality of engaging holes, said base including a first mounting wall having said pin-protruding face of said base and said first mounting face, a base surrounding wall connected to said cover surrounding wall, and a plurality of engaging pieces projecting from said base surrounding wall and engaged respectively to said engaging holes.

10. The electronic device package box of claim 1, wherein said pin-protruding face of said base is perpendicular to said first mounting face, said cover further having a pin-protruding face perpendicular to said second mounting face, said second connection section of each of said second pins protruding from said pin-protruding face of said cover.

* * * * *